(12) United States Patent
Tamai et al.

(10) Patent No.: US 6,661,117 B2
(45) Date of Patent: Dec. 9, 2003

(54) LOAD DRIVING SYSTEM AND METHOD THEREOF

(75) Inventors: Yasuhiro Tamai, Shizuoka-ken (JP); Tetsuya Hasegawa, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/104,027

(22) Filed: Mar. 25, 2002

(65) Prior Publication Data

US 2002/0136037 A1 Sep. 26, 2002

(30) Foreign Application Priority Data

Mar. 26, 2001 (JP) .......................................... 2001-87722

(51) Int. Cl.[7] .............................. B60L 1/00; G05F 1/613
(52) U.S. Cl. ...................................... 307/10.8; 323/225
(58) Field of Search .............................. 363/17, 16, 20, 363/19, 71; 323/273, 284, 281, 225; 307/10.8, 10.2, 82; 340/468, 466, 464, 765, 908

(56) References Cited

U.S. PATENT DOCUMENTS 5,202,668 A * 4/1993 Nagami ...................... 340/705

FOREIGN PATENT DOCUMENTS

JP        5-168164        7/1993

* cited by examiner

*Primary Examiner*—Rajnikant B. Patel
(74) *Attorney, Agent, or Firm*—Finnegan, Henderson, Farabow, Garrett & Dunner, L.L.P.

(57) ABSTRACT

A system and method for driving a load at a voltage higher than a normal driving voltage, being capable of reducing switching losses and heat generation amount.

A load driving system 1 has a microcomputer 2, a DC/DC converter 3, and a semiconductor relay 5 provided to each lamp 4 as a load. The DC/DC converter 3 has a main switch 6, an auxiliary switch 7, and a resistor R1. A rectangular pulse signal at a desired duty ratio is given to the main switch 6 to turn the main switch 6 on and off, thereby to output a rectangular waveform voltage. A drive signal is given to the semiconductor relay 5 to supply the rectangular waveform voltage outputted from the DC/DC converter 3 to the lamp 4, illuminating the lamp 4.

11 Claims, 5 Drawing Sheets

LOAD DRIVING SYSTEM AND METHOD THEREOF

BACKGROUND OF THE INVENTION

1. Field of the Invention

This invention relates to a load driving system and method thereof for driving loads using a power source having an output voltage higher than a normal driving voltage of the loads, and more particularly, to an art of simplifying the circuitry and reducing its heat generation amount.

2. Description of the Related Art

The voltage of a battery power source mounted to vehicles such as automobiles and trucks is generally 12 volts or 24 volts. The recent trend is to use a higher battery voltage (52 volts, for example) in order to reduce the value of the current flowing into various circuits or loads mounted to a vehicle. However, such loads as lamps mounted to a vehicle are designed for a conventional battery voltage of 12 volts or 24 volts and cannot be driven when being directly connected to a 52-volts DC power source.

It is thus necessary to replace loads mounted to a vehicle with ones designed for a voltage of 52 volts to match a 52-volts battery voltage. However, such increase in a driving voltage of such lamps as head lamps, tail lamps, brake lamps and room lamps mounted to a vehicle (that is, designing the lamps for 52 volts) results in increase in the size of these devices, causing cost increase, and thus being impractical.

Under these circumstances, various kinds of load driving system for driving loads with a voltage higher than a normal driving voltage without overloading have been proposed and put to practical use. An example of such conventional load driving systems is disclosed in Japanese Patent Laid-Open Publication No. Hei-5-168164 (hereinafter referred to as a "conventional example").

FIG. 1 is a circuit diagram of a load driving system described in the conventional example. As shown in the figure, the 7 load driving system has a DC power source 101 and an FET 106 directly connected to a lamp 102 as a load. The system further includes a voltage detector 104, a PWM controller 105, and a switch 103.

The PWM controller 105 outputs a pulse signal to the FET 106 to cause it to turn on and off so as to provide a root-mean-square value of the voltage supplied to the lamp 102 smaller than the output voltage of the DC power source 101, thereby preventing the lamp 102 from being overloaded when illuminated.

In the above conventional load driving system, however, the switching operation of the FET 106 based on PWM signals generates switching losses, increasing the amount of heat generated by the element, and resulting in an increased size of a heat sink.

Another method being proposed is shown in FIG. 2, in which a DC/DC converter is used to step down a voltage supplied from a DC power source. Specifically, as shown in the figure, the DC/DC converter has a main switch 110 and an auxiliary switch 111 switched at a desired duty ratio in order to convert the input voltage Vin supplied from the DC power source to a pulsed voltage. The pulse voltage is rectified and smoothed via a circuit consisting of a diode D101, a coil L101 and a capacitor C101 and is output as the output voltage Vout.

The DC/DC converter thus using the auxiliary switch 111 and a resistor R101 connected to the switch 111 has an advantage of reduced switching losses as compared with only performing PWM control. However, the DC/DC converter continuously outputs a low voltage and requires the coil L101 and the capacitor C101 for use as a filter. This disadvantageously complicates the circuitry. Further, there is a problem of heat generated by the coil L101 and the capacitor C101.

When a component constituting part of the DC/DC converter cannot be surface-mounted, heat generated by the component is dissipated inside a case housing the component, increasing the entire temperature inside the case.

Further, power is supplied even when the main switch 110 is off, which prevents lowering the operating frequency of the main switch 110.

It would be conceived to provide an auxiliary switch similar to the auxiliary switch 111 shown in FIG. 2 to each switching element (FET 106 shown in FIG. 1) for driving loads so as to reduce switching losses. This method, however, increases the number of switching elements, resulting in entire cost increase, and thus being impractical.

As described above, the conventional load driving system shown in FIG. 1 disadvantageously causes great switching losses. The DC/DC converter shown in FIG. 2 has a large amount of heat generated from the components and cannot be lowered in the operating frequency.

SUMMARY OF THE INVENTION

This invention was made to solve the above conventional problems, and has an object of providing a load driving system capable of reducing losses and noise associated with the switching operation and also reducing the amount of heat generation.

According to a first technical aspect of this invention, there is provided a driving system connected to a DC power source which supplies a predetermined output voltage, for driving at least one load, which has a voltage converter having a first switch for converting a voltage outputted from the power source to a pulse voltage having a desired duty ratio for output, the first switch generating the pulse voltage in response to a first control signal; and a second switch connected between the voltage converter and the load, the second switch turning on and off in response to a second control signal.

According to a second aspect of this invention, there is provided a method for driving at least one load using a DC power source supplying a predetermined output voltage, which has the steps of converting a voltage outputted from the power source to a pulse voltage having a desired duty ratio for output in response to a first control signal; and selectively switching between conductive and non-conductive states of the pulse voltage to the load in response to a second signal, wherein, to make the load in a conductive state, the second control signal is outputted to switch from the non-conductive state to the conductive state during an off state of the pulse voltage.

DETAILED DESCRIPTION OF THE PREFERRED EMBODIMENTS

Figure 3:
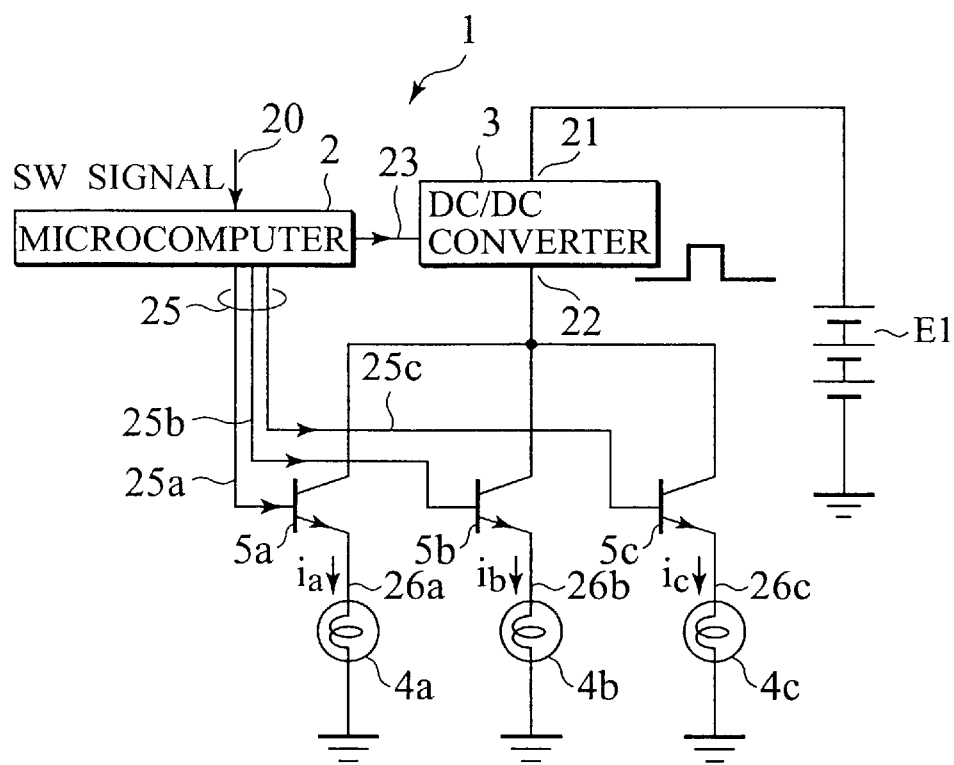
FIG. 3 is a circuit diagram illustrating the construction of a load driving system according to an embodiment of this invention.

With reference to the accompanying drawings, an embodiment of this invention will be described in detail below. FIG. 3 shows a circuit diagram illustrating the construction of a load driving system according to the embodiment of this invention. A load driving system 1 drives a plurality of loads 4(4a–4c) including various lamps such as head lamps, tail lamps, brake lamps, and room lamps mounted to a vehicle, using a voltage source of a higher voltage than a voltage for normally driving those lamps. The load driving system 1 includes a microcomputer 2 (controller) for controlling the total load driving system 1, a DC/DC converter (voltage converter) 3 for converting a DC voltage outputted from a DC power source E1 to a rectangular pulse voltage at a desired duty ratio, and a switching means 5 such as a solid-state relay provided to each of the plurality of lamps 4 (three in the figure).

The DC power source E1 is a battery mounted to the vehicle, and outputs a DC voltage of 52 volts, for example. The lamps 4 used in this embodiment are designed for use normally at 12 volts (a conventionally-used battery voltage, hereinafter referred to as a "normal driving voltage"), for example. Thus in this embodiment, provided is a load driving system for connecting the loads 4 designed for a normal driving voltage to a voltage source of a higher voltage than the normal driving voltage (hereinafter referred to as a "higher driving voltage") and stably driving the loads.

Figure 4:
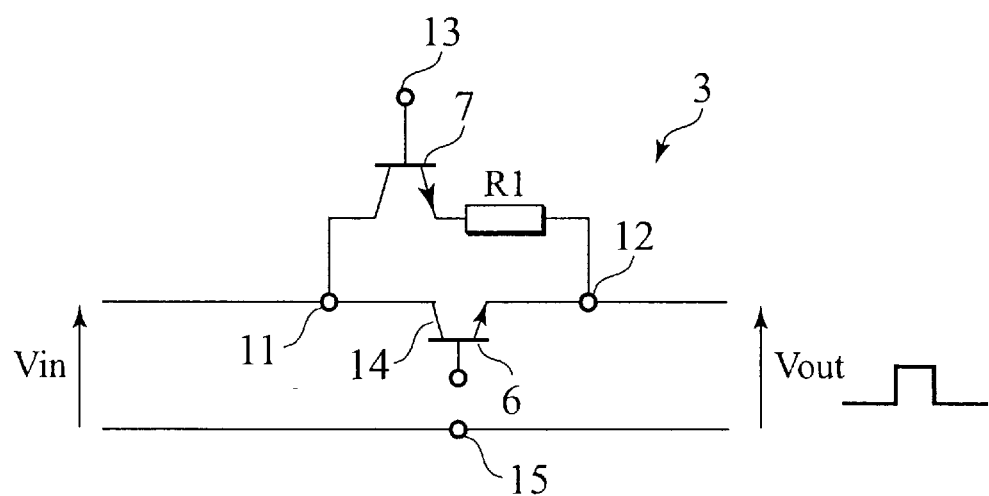
FIG. 4 is a circuit diagram illustrating in detail the construction of a DC/DC converter.

FIG. 4 is a circuit diagram illustrating in detail the construction of the DC/DC converter 3 used in this embodiment. The DC/DC converter 3 includes a main switch 6 in the form of a transistor (FET) as a switching element which turns on and off in synchronization with a pulse signal supplied as a control signal. The main switch 6 is referred to as a first switch in the appended claims. Switching elements applicable to this invention include a transistor (bipolar transistor, FET), and preferably are semiconductor switching elements for controlling a current or voltage in response to a control signal. In this embodiment, a control signal is applied to a gate (or a base) 14 as a control terminal.

A series connection circuit of an auxiliary switch 7 in the form of a semiconductor switch such as a transistor and a resistor R1 is disposed in parallel with the main switch 6. The auxiliary switch 7 is referred to as a third switch in the appended claims. Rectangular pulse signals are supplied to the gates (or bases) of the main switch 6 and the auxiliary switch 7 to turn the switches 6 and 7 on and off (alternately) so as to convert a voltage (Vin) outputted from the DC power source E1 to a rectangular pulse voltage (Vout) at a desired duty ratio for output. An output pulse is specified by a pulse width and a pulse interval, or a duty ratio between the on period and the off period of the pulse. Any of these pulse control information pieces can be used for the control of the main switch 6.

The microcomputer 2 shown in FIG. 3 is a controller for the driving system. The microcomputer 2 generates a rectangular pulse signal and outputs the signal to the DC/DC converter 3. The microcomputer 2 also outputs a drive signal to each relay 5 in response to a switch signal (an illumination command input for each lamp 4 given via a vehicle LAN) 20. The relays 5(5a–5c) switch on and off the respective loads in accordance with commands from the microcomputer 2, whereby the load(s) to be operated is (are) selected. The relays 5 are preferably solid-state relays in the form of semiconductor switching elements such as transistors. In the appended claims, the relays 5 are referred to as second switches.

Figure 5:
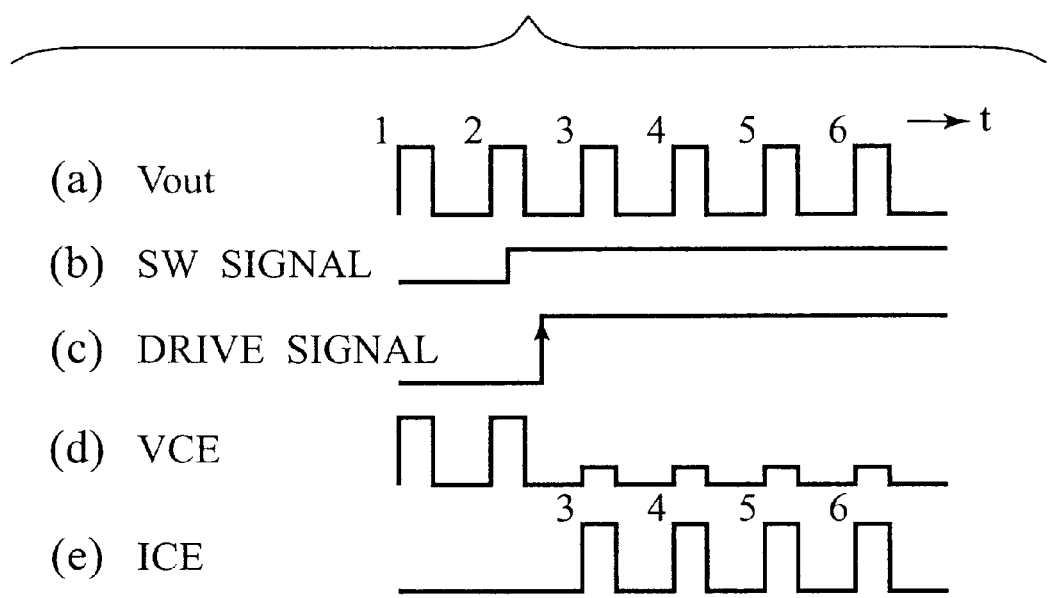
FIG. 5 is a timing chart illustrating the operation of the embodiment of this invention, in which. (a) illustrates the output voltage of the DC/DC converter 3, (b) a switch signal, (c) a drive signal, (d) the voltage (VCE) applied to a semiconductor relay, and (e) the current ICE flowing through the semiconductor relay.

Now the operation of the load driving system 1 according to this embodiment is described with reference to the timing chart shown in FIG. 5. The microcomputer 2 outputs a rectangular pulse signal specified by pulse control information such as a duty ratio to the main switch 6 of the DC/DC converter 3. The duty ratio or the like is set or adjusted so as to make a root-mean-square value or effective value of the output rectangular voltage (Vout) a predetermined voltage such as substantially 12 volts as a normal driving voltage. In this embodiment, three loads 4a to 4c are connected. When a plurality of loads are connected, each load can be independently operated in response to the switch signal 20. There is thus a possibility that power consumption be varied according to the amplitude of a supplied voltage 22. To diminish the deviation of the supplied voltage, pulse control information can be modified or adjusted as necessary in accordance with the selected state of the loads.

The auxiliary switch 7 receives a rectangular pulse turning on and off in such timing as to turn the auxiliary switch 7 from off to on (rising) immediately before the main switch 6 turns from off to on, and to turn the auxiliary switch 7 from on to off (falling) immediately after the main switch 6 turns from on to off. Thus the auxiliary switch 7 is in an on state when the main switch 6 turns from off to on or from on to off, allowing for a potential difference VCE across the main switch 6 of substantially 0 volt.

As shown in FIG. 5(a), the voltage signal Vout of a rectangular waveform (having a root-mean-square value of about 12 volts) is outputted from the DC/DC converter 3. When receiving a switch signal as shown in FIG. 5(b) via the vehicle LAN (not shown) for illuminating a specified lamp 4, the microcomputer 2 outputs a drive signal 25 as shown in FIG. 5(c) as a selection signal. The drive signal 25 is controlled to turn from an off state to an on state when the output voltage of the DC/DC converter 3 is null (in an off state). More specifically, when any of the loads 4 to be driven is selected by the switch signal 20, the microcomputer 2 outputs the drive signal 25 to turn the relay 5 corresponding to the selected load 4 from an off state to an on state when the pulse voltage 22 supplied from the output of the DC/DC converter 3 is in an off state. In other words, when the switch signal for illuminating the lamp 4a is given when the output of the DC/DC converter 3 is on, the microcomputer 2 awaits until the output of the DC/DC converter 3 turns off and then controls the drive signal 25a to turn from off to on.

The drive signal 25 outputted from the microcomputer 2 is given to the relay 5. The value of the voltage (VCE)

applied across the switching terminals of the relay 5 is thus changed as shown in FIG. 5(d). That is, when the drive signal 25 (FIG. 5(c)) is in the off state, the output of the relay 5 has a high impedance, and the voltage VCE across the switching terminals has a significant amplitude in synchronization with the output voltage of the DC/DC converter 3. When the drive signal 25 is turned into the on state, the output of the relay 5 turns into a conductive state, and the amplitude or root-mean-square value of the voltage VCE becomes substantially null.

Thus the turning on of the drive signal 25 is followed by the current ICE flowing through the relay 5 into the load, having a current value in synchronization with the output voltage of the DC/DC converter 3.

Figure 6:
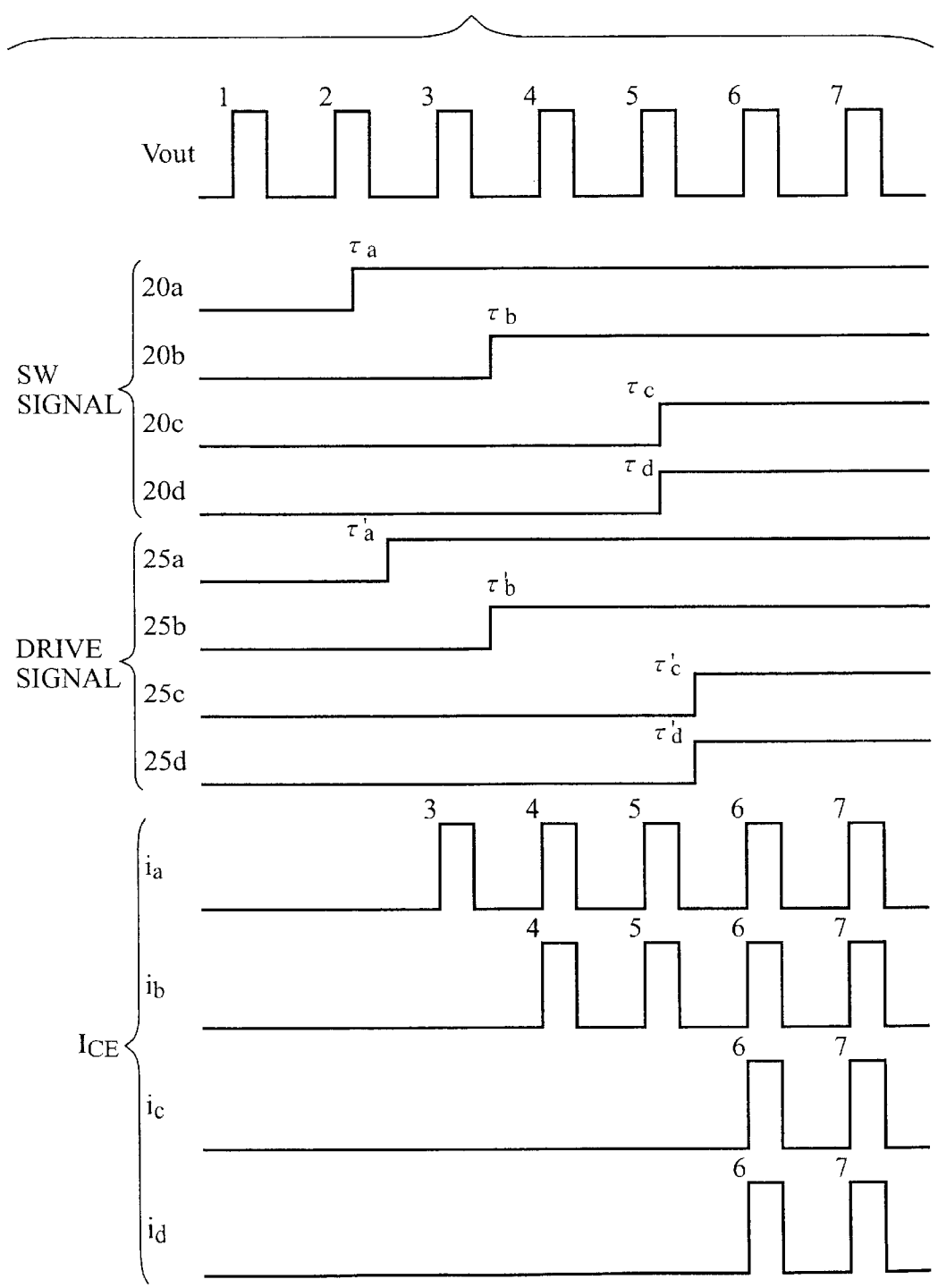
FIG. 6 is a timing chart illustrating in more detail the operation of the embodiment of this invention.

FIG. 6 shows an exemplary timing chart illustrating the driving of four loads. Regarding the load 4a, for example, a switch signal 20a is input (τa) when the second pulse (depicted by 1) of the voltage output Vout is generated. A drive signal 25a is not turned from off to on until the Vout pulse turns off. After the drive signal 25a turns on (τ'a), the third pulse (depicted by 3) of the voltage signal Vout (of a root-mean-square value of about 12 volts) is applied from the DC/DC converter 3. Thus a current pulse ia drives the load 4a. The load 4a operates at a root-mean-square value substantially identical to the normal driving voltage, realizing stable operation. To stop the operation of the load 4a, the driving signal 25a may be turned off under the control of the microcomputer 2.

Regarding the load 4b, a switch signal 20b is input (τb) when the Vout pulse is off. A drive signal 25b is thus switched into an on state without significant delay (τ'b). A current pulse ib corresponding to the voltage signal Vout of and after the fourth pulse drives the load 4b.

Regarding the loads 4c and 4d, switch signals 20c and 20d are input (τc, τd) when the fifth pulse of Vout is generated. Thus drive signals 25c and 25d are not turned into an on state until the Vout pulse turns off as in the case of the load 4a. When the signals 25c and 25d turn on (τ'c, τ'd), current pulses ic and id in correspondence with the voltage signal Vout of and after the sixth pulse drive the loads 4c and 4d.

In this manner, the load driving system of this embodiment uses the microcomputer 2 to control on and off of the drive signal 25n in response to the switch signal 20 for each lamp 4n (n=a, b, c, d, . . . ). This enables independent switching on and off of the two or more lamps 4, providing stable illumination. Further the auxiliary switch 7 and the resistor R1 are arranged in parallel with the main switch 6 in the DC/DC converter 3, and the auxiliary switch 7 is in an on state when the main switch 6 is turned on or off to bypass a transient current, thereby reducing switching losses of the main switch 6.

Figure 1:
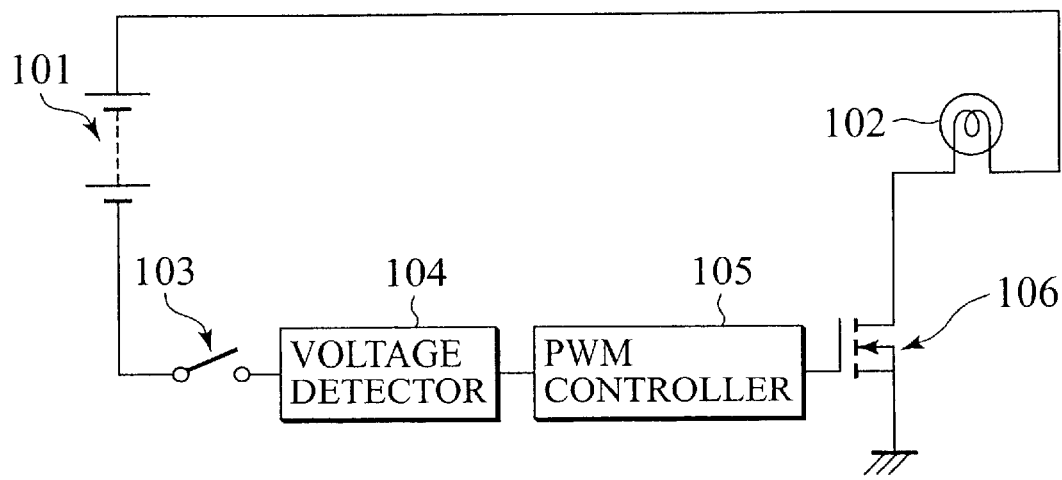
FIG. 1 is a circuit diagram illustrating the construction of a conventional load driving system.
Figure 2:
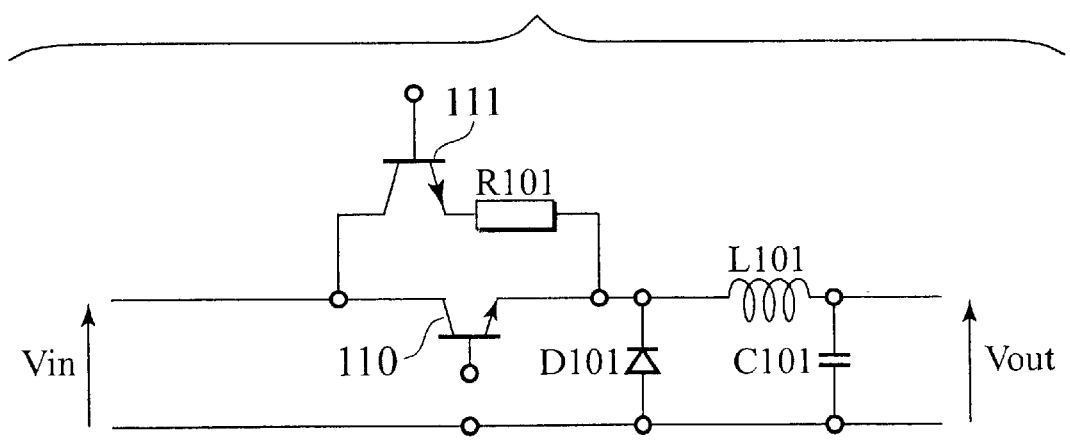
FIG. 2 is a circuit diagram illustrating the construction of a typical DC/DC converter.

Further, according to this invention, the DC/DC converter 3 does not require the inductance L101, the capacitor C101, and the diode D101 as shown in FIG. 2. The voltage 22 (Vout) outputted from the DC/DC converter 3 is supplied to the lamp 4 as the loads which require that power consumption be substantially within a predetermined range but not necessarily require a constant voltage. This invention is based on the fact that controlling such a load does not require the rectification and smoothing of a rectangular pulse voltage generated by the DC/DC converter 3. As a result, this invention eliminates elements for rectification and smoothing such as a coil, a capacitor, and a diode used in a typical DC/DC converter. This enables reduction in size of the circuitry and cost. The elimination of such elements reduces the heat generation amount, reducing the temperature rise in the entire system, thereby enabling the reduction in size of a heat sink. This further enables lowering the operating frequency.

Since the voltage 22 outputted from the DC/DC converter 3 is a rectangular pulse voltage, and the drive signal 25 is controlled in association with the state of the rectangular pulse, the relay 5 simply switches on and off in response to the drive signal 25. This eliminates the need for the duty-ratio control of each relay 5, and thus eliminates hardware and software required for the duty-ratio control.

Further, since the drive signal supplied to each relay 5 is controlled to turn on while the output voltage 22 of the DC/DC converter 3 is off (null), switching losses and switching noise of the relay 5 can be reduced.

Still further, the microcomputer 2 may control the DC/DC converter 3 to stop its operation after turning all the lamps 4 into the off state (no selection state). This enables reduction in power consumption, contributing to energy saving.

Figure 7A:
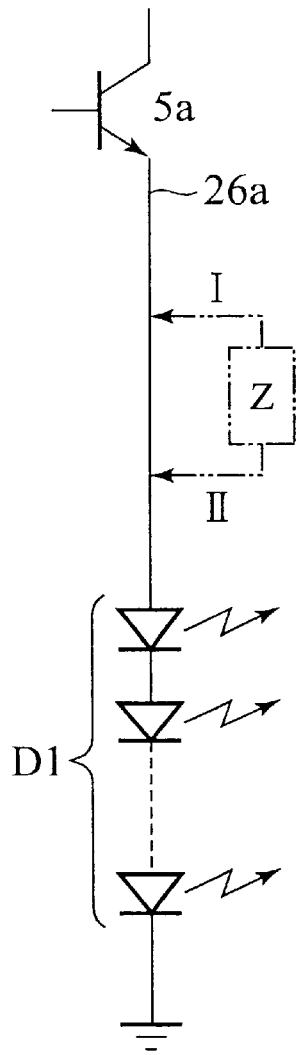
FIG. 7A shows an example of using a semiconductor light-emitting device D1 as a load 4a according to a modification of the embodiment of this invention.
Figure 7B:
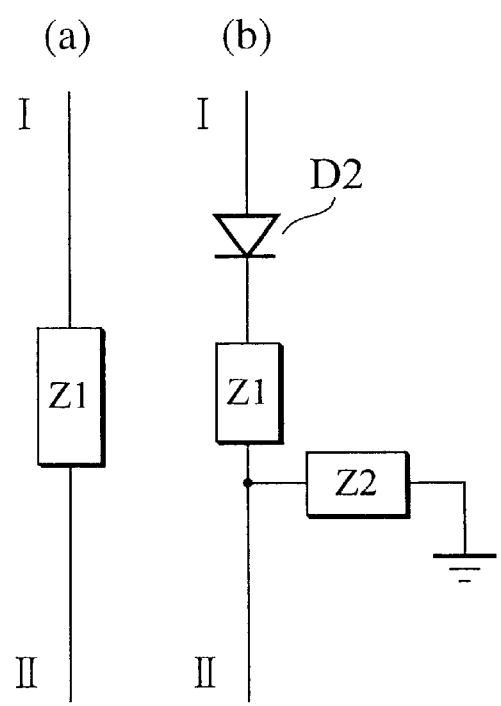
FIG. 7B shows examples of an additional circuit Z in FIG. 7A, in which (a) illustrates one using a resistive element Z1, and (b) illustrates one provided with a smoothing circuit.

The above description of the load driving system according to the embodiment of this invention with reference to the figures is not intended to limit this invention. Structure of each component can be replaced with any component having similar functions. For example, the above embodiment has been described with the lamps 4 as the loads. This invention is not limited to this application and can be applied to any load operative with specified power consumption. FIG. 7A illustrates the case where at least one of the loads such as the load 4a is a light-emitting device D1 with semiconductor light-emitting elements such as light-emitting diodes (LED) or organic electro-luminescence light emitting elements connected in series. An additional circuit Z such as a resistor Z1 for current limitation as shown in FIG. 7B(a) or an integrator as shown in FIG. 7B(b) may be inserted between an output line 26a of the relay 5a and D1. For example, Z1 is a resistor or inductance, and Z2 is capacitance.

The above embodiment has been exemplarily described with a battery mounted to a vehicle as the DC power source E1 and various lamps mounted to the vehicle as the loads. This invention is not limited to this application and can also be applied to the case where the load is driven with a higher voltage than a normal drive voltage of the load.

Further, the above embodiment is exemplarily described with respect to the driving of the three lamps (loads). This invention is not limited to this application and can also be applied to the case where at least one load is driven.

As described above, the load driving system according to this invention is provided with a voltage converter for outputting a rectangular pulse voltage and uses an electronic control switch to switch the output signal of the voltage converter on and off, thereby; supplying a voltage to a load. The voltage converter thus eliminates rectifying and smoothing elements, enabling the simplification of its structure and the reduction of heat generation amount. The electronic control switch is controlled simply to turn on and off in response to a drive signal. This eliminates PWM control, enabling the simplification of the processing by the controller. Further, the on and off switching of an auxiliary switch arranged in parallel with a main switch of a voltage converting means allows reduction in switching losses at the main switch.

Furthermore, since the drive signal supplied to the electronic control switch is turned from off to on when the pulse voltage outputted from the voltage converter is off, switching losses and switching noise of the electronic control switch can be reduced. Still further, when all loads are controlled to stop their operations, the voltage converting means can be controlled to stop its operation, thereby enabling reduction in power consumption and reduction in heat generation amount.

The entire content of a Japanese Patent Applications No. 2001-087722, filed on Mar. 26, 2001 is hereby incorporated by reference. Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:

1. A driving system connected to a DC power source which supplies a predetermined output voltage, for driving at least one load, comprising:
    a voltage converter having a first switch adapted to convert a voltage outputted from the power source to a pulse voltage having a desired duty ratio for output, the first switch being adapted to generate the pulse voltage in response to a first control signal; and
    a second switch connected between the voltage converter and the load, the second switch being adapted to turn on and off in response to a second control signal.

2. A driving system connected to a DC power source which supplies a predetermined output voltage, for driving at least one load, comprising:
    a voltage converter having a first switch adapted to convert a voltage outputted from the power source to a pulse voltage having a desired duty ratio for output; and
    a second switch connected between the voltage converter and the load, the second switch being controlled to switch from an off state to an on state during an off state of the output of the voltage converter.

3. A driving system of claim 1, further comprising a controller for outputting the first control signal to the voltage converter and outputting the second control signal to the second switch; wherein,
    the controller turns the second switch into an on state while the output of the voltage converter is off.

4. A driving system of claim 3, wherein the controller stops the operation of the voltage converter when no load is driven.

5. A driving system of claim 1 or 2, wherein:
    the voltage converter has a series connection circuit of a third switch and a resistor disposed in parallel with the first switch; and
    the third switch is turned into an on state immediately before the first switch turns from off to on, and is turned into an off state immediately after the first switch turns from on to off.

6. A driving system of claim 1 or 2, wherein the power source is a battery mounted to a vehicle and supplies a voltage higher than a normal driving voltage of the load.

7. A driving system of claim 1 or 2, wherein the at least one load is a lamp mounted to a vehicle.

8. A driving system of claim 1, wherein the load can be specified in operation by at least the power consumption thereof.

9. A driving system of claim 1, wherein the at least one load is at least one semiconductor light-emitting element.

10. A driving system of claim 1, wherein the voltage converter has a duty ratio adjusted in accordance with a driving state of the loads.

11. A method for driving at least one load using a DC power source supplying a predetermined output voltage, comprising the steps of:
    converting a voltage outputted from the power source to a pulse voltage having a desired duty ratio for output; and
    selectively switching between conductive and non-conductive states of the pulse voltage to the load in response to a control signal; wherein,
    to make the load in a conductive state, the control signal is outputted to switch from the non-conductive state to the conductive state during an off state of the pulse voltage.

* * * * *